United States Patent
Ryan

(10) Patent No.: US 8,885,438 B1
(45) Date of Patent: Nov. 11, 2014

(54) STARTUP CIRCUIT DETECTING STABLE SYSTEM CLOCK

(75) Inventor: Robert P. Ryan, Mission Viejo, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 98 days.

(21) Appl. No.: 13/570,118

(22) Filed: Aug. 8, 2012

(51) Int. Cl.
*G11C 8/00* (2006.01)
*G11C 7/22* (2006.01)

(52) U.S. Cl.
CPC ........................................ *G11C 7/22* (2013.01)
USPC .................... 365/233.1; 365/233.5; 365/236; 365/226

(58) Field of Classification Search
CPC ........... G11C 7/22; G11C 7/072; G11C 7/222
USPC ................................ 365/233, 233.5, 236, 226
See application file for complete search history.

(56) References Cited

U.S. PATENT DOCUMENTS

| | | |
|---|---|---|
| 5,243,637 A | 9/1993 | Flaherty et al. |
| 5,377,205 A | 12/1994 | Shi |
| 5,742,800 A | 4/1998 | Forehand |
| 6,252,444 B1 * | 6/2001 | Lee ................. 327/156 |
| 7,518,419 B1 * | 4/2009 | Pasqualini ........... 327/143 |
| 7,679,411 B2 | 3/2010 | Sakai et al. |
| 8,147,479 B1 * | 4/2012 | Wach et al. ............ 604/522 |
| 2006/0017475 A1 | 1/2006 | Kazuma |
| 2009/0168943 A1 * | 7/2009 | Chao et al. ............ 375/376 |
| 2011/0010493 A1 * | 1/2011 | Kimura et al. .......... 711/103 |
| 2011/0241791 A1 * | 10/2011 | Hung ................. 331/158 |

FOREIGN PATENT DOCUMENTS

WO   WO2012010926 A1   1/2012

* cited by examiner

*Primary Examiner* — Connie Yoha

(57) ABSTRACT

A startup circuit is disclosed operable to perform a startup operation for an electronic device comprising digital circuitry. The startup circuit comprises a first clock generator operable to generate a first clock comprising a first period, and a second clock generator operable to generate a second clock independent of the first clock. The second clock is operable to clock the digital circuitry and comprises a second period less than the first period. A first counter counts a first number of the second periods over the first period, and the second clock is enabled to clock the digital circuitry in response to the first counter.

21 Claims, 4 Drawing Sheets

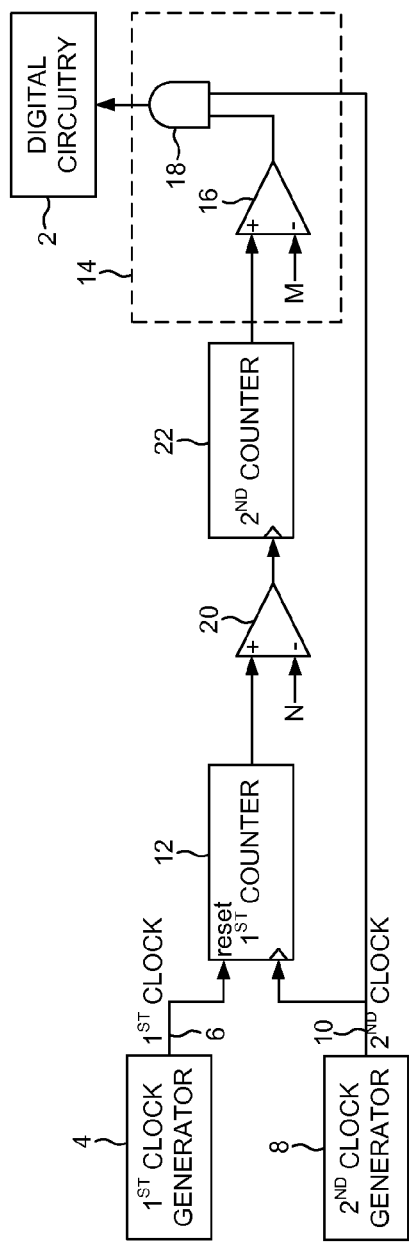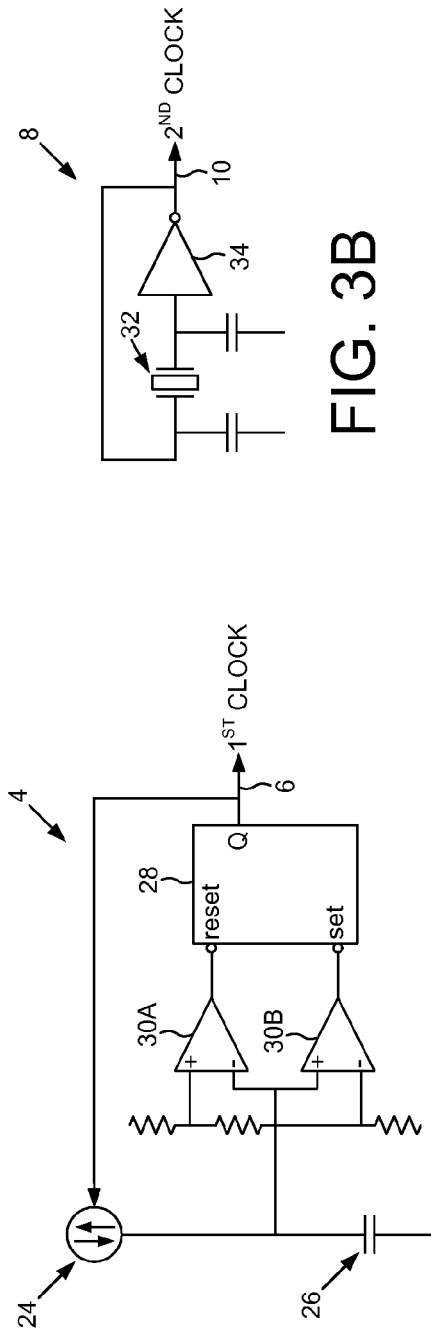

8,885,438 B1

STARTUP CIRCUIT DETECTING STABLE SYSTEM CLOCK

BACKGROUND

The startup time of electronic devices may be an important performance feature, such as with computing and consumer devices, including desktop and laptop computers, tablet computers, televisions, audio equipment, smartphones, cameras, etc. When an electronic device is powered on, various operating parameters must be allowed to settle, such as the supply voltage for powering digital circuitry as well as the system clock used to clock the digital circuitry. If these parameters are not allowed to settle, the digital circuitry will likely malfunction during the startup operation.

BRIEF DESCRIPTION OF THE DRAWINGS

FIG. 2 shows an embodiment of the present invention wherein a second counter enables the second clock to clock the digital circuitry when the number of clock cycles over the first clock period exceeds N at least M times.

FIG. 3A shows a first clock generator for generating the first clock according to an embodiment of the present invention.

FIG. 3B shows a second clock generator for generating the second clock according to an embodiment of the present invention.

DETAILED DESCRIPTION

Figure 1A:
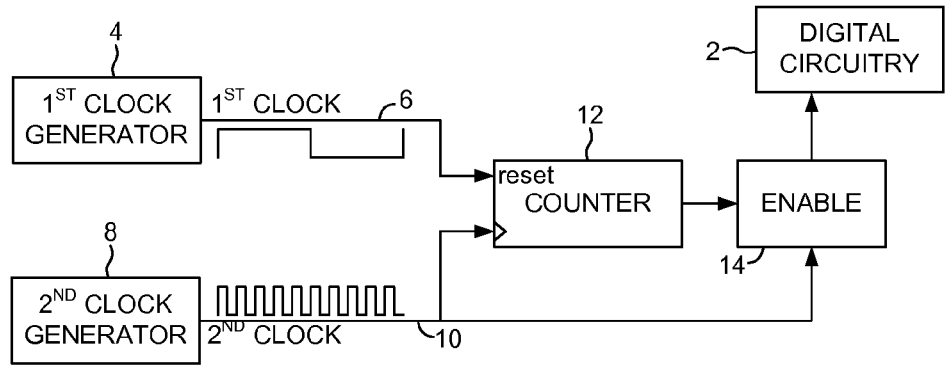
FIG. 1A shows a startup circuit according to an embodiment of the present invention for enabling a second clock to clock digital circuitry when a number of clock cycles reaches a target value over a first clock period.

FIG. 1A shows a startup circuit according to an embodiment of the present invention operable to perform a startup operation for an electronic device comprising digital circuitry 2. The startup circuit comprises a first clock generator 4 operable to generate a first clock 6 comprising a first period, and a second clock generator 8 operable to generate a second clock 10 independent of the first clock 6. The second clock 10 is operable to clock the digital circuitry 2 and comprises a second period less than the first period. A first counter 12 is operable to count a first number of the second periods over the first period, and an enable circuit 14 is operable to enable the second clock 10 to clock the digital circuitry 2 in response to the first counter 12.

In one embodiment, when the electronic device comprising the digital circuitry 2 shown in FIG. 1A is initially powered on, there is an unknown delay before the second clock generator 8 begins to oscillate at a stable frequency. If the second clock 10 were allowed to begin clocking the digital circuitry 2 immediately upon power on, the unstable oscillations of the second clock 10 may cause the digital circuitry 2 to malfunction. Accordingly, in the embodiments of the present invention the first clock 6 is used to verify the second clock 10 is oscillating at a stable frequency before enabling the second clock 10 to clock the digital circuitry 2.

In the embodiment shown in FIG. 1A, the first clock 6 enables the second clock 10 when the number of clock cycles (periods) of the second clock 10 over a first clock cycle (period) of the first clock 6 reaches a predetermined threshold. The first clock 6 resets the first counter 12 at the beginning of the cycle of the first clock 6, and then the second clock 10 clocks the first counter 12 over the cycle of the first clock 6. The output of the first counter 12 is continuously evaluated by the enable circuit 14. If the output of the first counter 12 reaches the predetermined threshold during the cycle of the first clock 6, then the enable circuit 14 enables the second clock 10 to clock the digital circuitry 2. If at the end of the cycle of the first clock 6 the output of the first counter 12 has not reached the predetermined threshold, then the first clock 6 resets the counter 12 at the beginning of the next cycle of the first clock 6. The above-described operation is repeated until the output of the first counter 12 reaches the predetermined threshold during a cycle of the first clock 6.

Figure 1B:
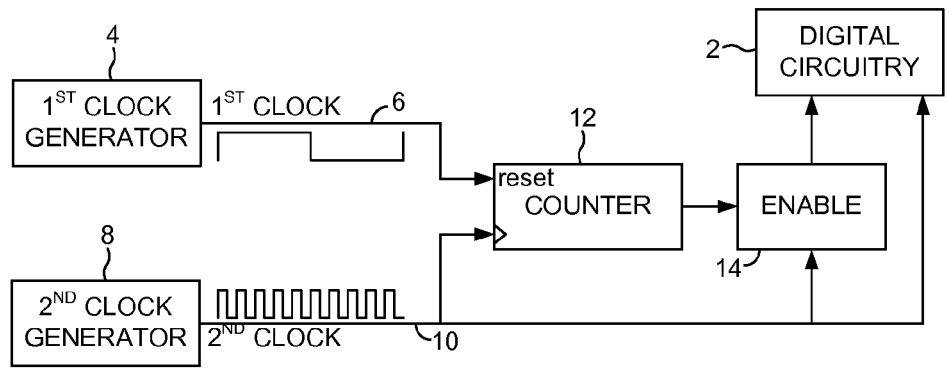
FIG. 1B shows an embodiment of the present invention wherein the second clock is enabled to clock the digital circuitry by enabling the clocking of the digital circuitry.

The second clock 10 may be enabled to clock the digital circuitry 2 in any suitable manner. In the embodiment shown in FIG. 1A, the enable circuit 14 applies the second clock 10 to the digital circuitry 2 when the first counter 12 reaches the predetermined threshold. In an alternative embodiment shown in FIG. 1B, the enable circuit 14 may enable the second clock 10 by enabling the clocking of the digital circuitry 2. That is, the second clock 10 may be applied to the digital circuitry 2 at the beginning of the startup operation, but the digital circuitry 2 may be disabled by the enable circuit 14 until the first counter 12 reaches the predetermined threshold.

Figure 1C:
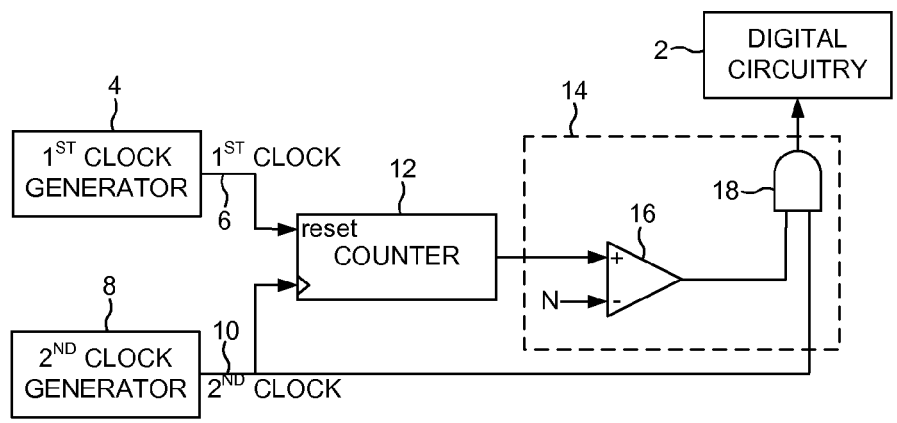
FIG. 1C shows an embodiment of the present invention wherein the second clock is enabled to clock the digital circuitry when the number of clock cycles over the first clock period exceeds a threshold.

FIG. 1C shows a startup circuit according to an embodiment of the present invention wherein the enable circuit 14 enables the second clock 10 to clock the digital circuitry 2 when the output of the first counter 12 exceeds a first threshold N at comparator 16. The output of the comparator 16 enables the second clock 10 through an AND gate 18. In one embodiment, the output of the first counter 12 is compared to the first threshold N at the end of each cycle of the first clock 6, whereas in the embodiment of FIG. 1A, the output of the first counter 12 may be evaluated continuously during a cycle of the first clock 6. In another embodiment, the enable circuit 14 may enable the second clock 10 to clock the digital circuitry 2 if the output of the first counter 12 falls within a predetermined range (between a lower and upper threshold) at the end of a cycle of the first clock 6.

FIG. 2 shows a startup circuit according to an embodiment of the present invention wherein the output of the first counter 12 is compared to a first threshold N at comparator 20, and the output of comparator 20 is used to clock a second counter 22. The enable circuit 14 enables the second clock 10 to clock the digital circuitry 2 when the output of the second counter 22 exceeds a second threshold M at comparator 16. Accordingly, in this embodiment the second counter 22 counts a second number of times the first number (generated by the first counter 12) exceeds the first threshold N, wherein the enable circuit 14 enables the second clock 10 when the second number exceeds the second threshold M. In one embodiment, the second counter 22 may be reset if the first number does not exceed the first threshold N consecutively. That is, in one embodiment the first number must exceed the first threshold N for at least M consecutive cycles of the first clock 6 before the enable circuit 14 will enable the second clock 10.

FIG. 3A shows an embodiment of the first clock generator 4 for generating the first clock 6. The first clock generator 4 comprises a current source 24 for charging a capacitor 26, wherein the polarity of the current source 24 is alternated by a register 28 controlled by comparators 30A and 30B. The resulting first clock 6 will oscillate at a frequency determined by the current source 24, the capacitor 26, and the threshold voltage between comparators 30A and 30B. FIG. 3B shows an embodiment of the second clock generator 8 for generating the second clock 10. The second clock generator 8 comprises a crystal resonator 32 in the feedback path of an inverter 34 loop, wherein the second clock 10 will oscillate at a frequency determined by the mechanical resonance of the crystal resonator 32.

Figure 4A:
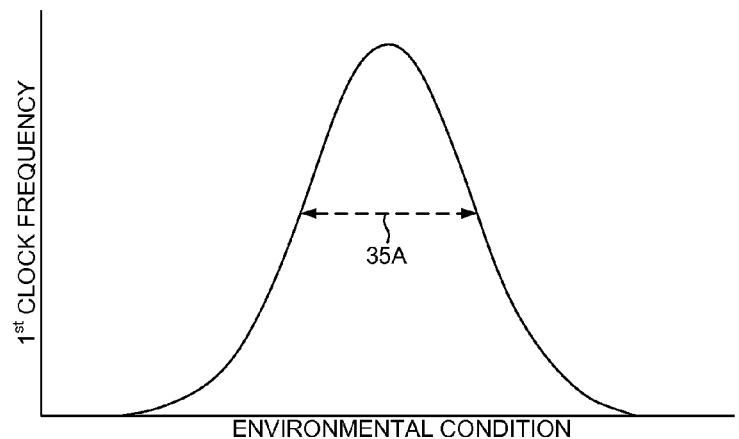
FIGS. 4A and 4B illustrate an embodiment of the present invention wherein a standard deviation of the second clock is less than half a standard deviation of the first clock.
Figure 4B:
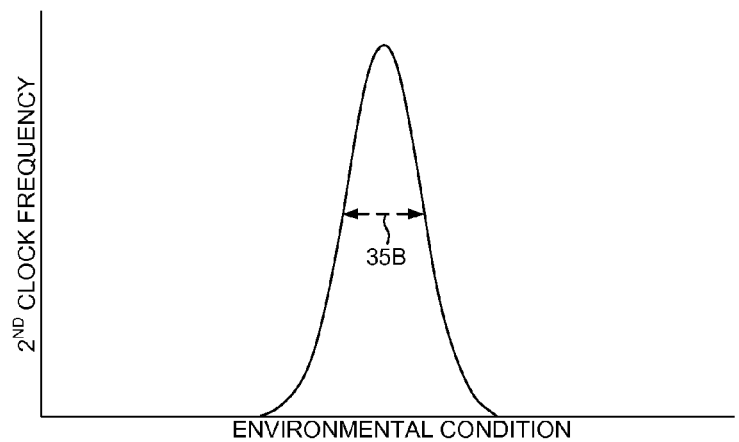

In one embodiment, the first clock generator 4 (such as shown in FIG. 3A) and the second clock generator 8 (such as shown in FIG. 3B) generate their respective clocks at different frequencies based on an environmental condition. For example, each clock generator may generate the respective clock at a different frequency based on the ambient temperature at the time of the startup operation. This is illustrated in FIGS. 4A and 4B which show a distribution of frequencies for the first and second clocks, wherein the startup frequency will vary based on the environmental condition at the time of the startup operation. In one embodiment, the frequency distribution of the second clock 10 (FIG. 4B) has a standard deviation 35B less than half the standard deviation 35A of the first clock 6 (FIG. 4A). In other words, the second clock generator 8 will deviate within a narrow frequency range compared to the first clock generator 4 so that the second clock 10 is generated at a frequency that ensures reliable operation of the digital circuitry 2. The startup circuit in the embodiments of the present invention will operate reliably over a wider frequency distribution of the first clock 6 which enables the use of a suitable first clock generator 4, such as the capacitor based oscillator shown in FIG. 3A.

Figure 5:
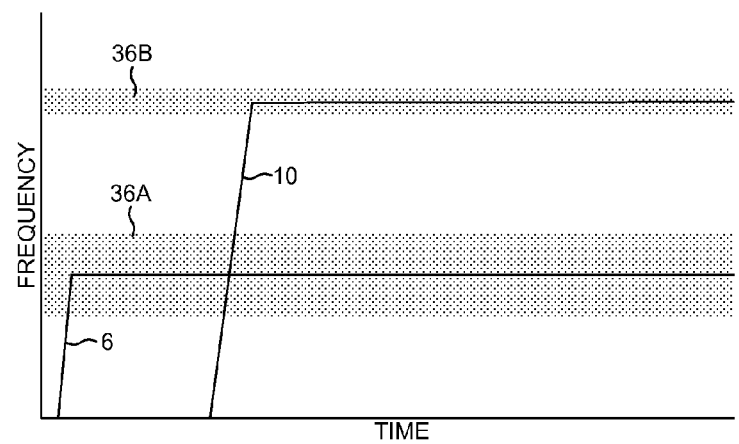
FIG. 5 shows an embodiment of the present invention wherein at a beginning of the startup operation the first clock begins oscillating significantly sooner than the second clock.

In one embodiment, the first clock generator 4 (such as shown in FIG. 3A) will begin oscillating substantially sooner than the second clock generator 8 (such as shown in FIG. 3B) at the beginning of the startup operation. This is illustrated in FIG. 5 wherein the first clock 6 will begin oscillating almost immediately at the beginning of the startup operation, whereas the second clock 10 begins oscillating after a substantially longer (and unknown) delay. This embodiment ensures that the first clock 6 is oscillating in the startup circuit before the second clock 10 so that the first clock 6 can verify when the second clock 10 begins oscillating at a stable frequency as described above. FIG. 5 also illustrates the different frequency ranges 36A and 36B the first clock 6 and second clock 10 may oscillate depending on the environmental conditions at the time of the startup operation as described above.

Figure 6:
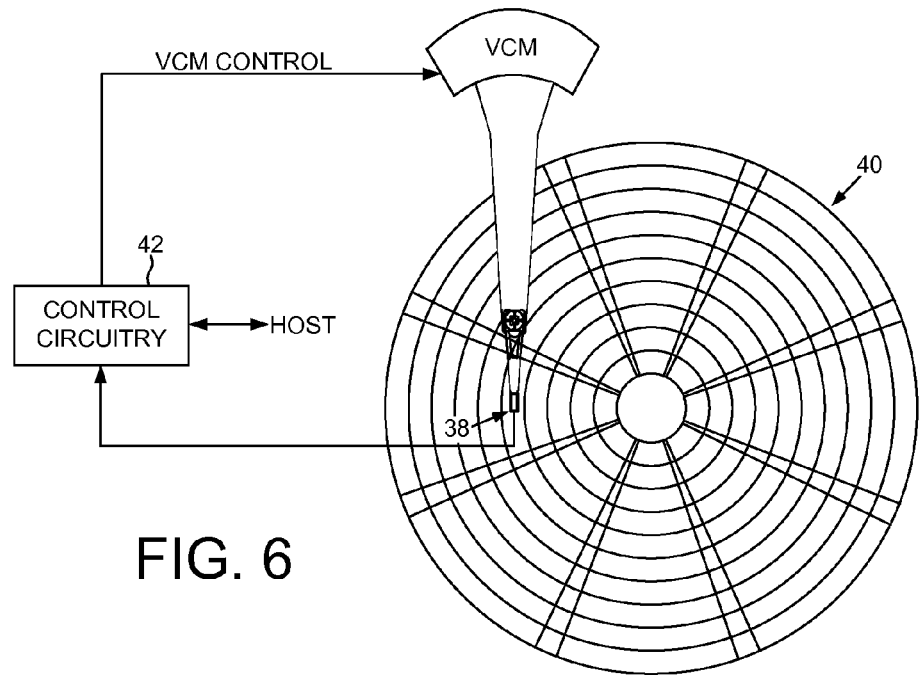
FIG. 6 shows a data storage device in the form of a disk drive comprising the startup circuit according to an embodiment of the present invention.
Figure 7:
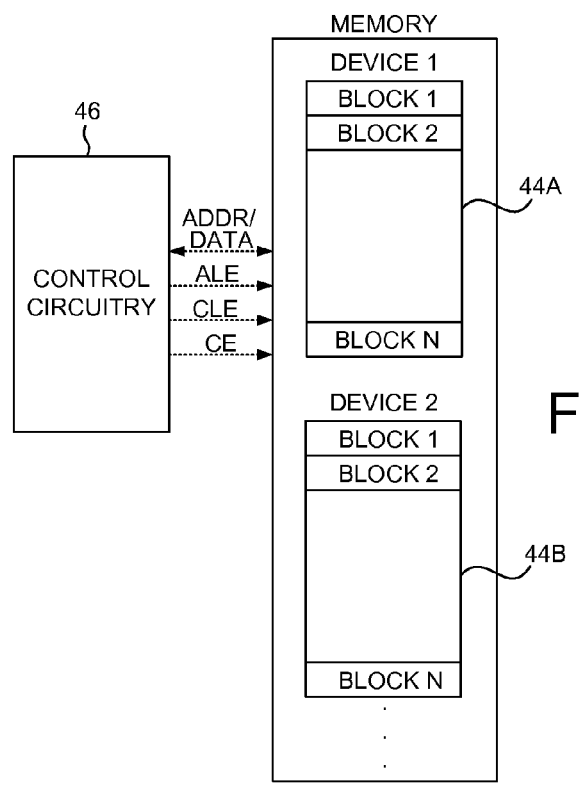
FIG. 7 shows a data storage device in the form of a solid state drive comprising the startup circuit according to an embodiment of the present invention.

The startup circuit in the embodiments of the present invention may be employed in any suitable electronic device. In one embodiment, the startup circuit may be employed in a suitable data storage device comprising a non-volatile memory and control circuitry that includes the startup circuit. FIG. 6 shows an embodiment of a data storage device in the form of a disk drive comprising a head 38 actuated over a disk 40, and control circuitry 42 utilizing the startup circuit. FIG. 7 shows another embodiment of a data storage device in the form of a solid state drive comprising a plurality of non-volatile semiconductor memories 44A and 44B, and control circuitry 46 utilizing the startup circuit. A hybrid data storage system may also utilize the startup circuit comprising components of a disk drive shown in FIG. 6 combined with the non-volatile semiconductor memories shown in FIG. 7.

What is claimed is:

1. A startup circuit operable to perform a startup operation for an electronic device comprising digital circuitry, the startup circuit comprising:
    a first clock generator operable to generate a first clock comprising a first period;
    a second clock generator operable to generate a second clock independent of the first clock, wherein the second clock is operable to clock the digital circuitry and comprises a second period less than the first period;
    a first counter operable to count a first number of the second periods over the first period; and
    an enable circuit operable to enable the second clock to clock the digital circuitry in response to the first counter.

2. The startup circuit as recited in claim 1, wherein the enable circuit is operable to enable the second clock when the first number exceeds a first threshold.

3. The startup circuit as recited in claim 2, further comprising a second counter operable to count a second number of times the first number exceeds the first threshold, wherein the enable circuit is operable to enable the second clock when the second number exceeds a second threshold.

4. The startup circuit as recited in claim 1, wherein the first clock generator comprises a timing capacitor.

5. The startup circuit as recited in claim 1, wherein the second clock generator comprises a crystal resonator.

6. The startup circuit as recited in claim 1, wherein:
    the first clock generator is operable to generate the first clock at different frequencies based on an environmental condition, wherein a frequency distribution for the first clock comprises a first standard deviation; and
    the second clock generator is operable to generate the second clock at different frequencies based on the environmental condition, wherein a frequency distribution for the second clock comprises a second standard deviation less than half the first standard deviation.

7. The startup circuit as recited in claim 1, wherein at a beginning of the startup operation the first clock is operable to begin oscillating substantially sooner than the second clock.

8. A method of performing a startup operation for an electronic device comprising digital circuitry, the method comprising:
    generating a first clock comprising a first period;
    generating a second clock independent of the first clock, wherein the second clock is operable to clock the digital circuitry and comprises a second period less than the first period;
    counting a first number of the second periods over the first period; and
    enabling the second clock to clock the digital circuitry in response to the first number.

9. The method as recited in claim 8, further comprising enabling the second clock when the first number exceeds a first threshold.

10. The method as recited in claim 9, further comprising counting a second number of times the first number exceeds the first threshold, and enabling the second clock when the second number exceeds a second threshold.

11. The method as recited in claim 8, wherein:
    the first clock generator is operable to generate the first clock at different frequencies based on an environmental condition, wherein a frequency distribution for the first clock comprises a first standard deviation; and the second clock generator is operable to generate the second clock at different frequencies based on the environmental condition, wherein a frequency distribution for the second clock comprises a second standard deviation less than half the first standard deviation.

12. The method as recited in claim 8, wherein at a beginning of the startup operation the first clock begins oscillating substantially sooner than the second clock.

13. A data storage device comprising:
- a non-volatile memory; and
- control circuitry comprising digital circuitry and a startup circuit operable to perform a startup operation for the data storage device, the startup circuit comprising:
  - a first clock generator operable to generate a first clock comprising a first period;
  - a second clock generator operable to generate a second clock independent of the first clock, wherein the second clock is operable to clock the digital circuitry and comprises a second period less than the first period;
  - a first counter for counting a first number of the second periods over the first period; and
  - an enable circuit operable to enable the second clock to clock the digital circuitry in response to the first counter.

14. The data storage device as recited in claim 13, wherein the enable circuit is operable to enable the second clock when the first number exceeds a first threshold.

15. The data storage device as recited in claim 14, further comprising a second counter operable to count a second number of times the first number exceeds the first threshold, wherein the enable circuit is operable to enable the second clock when the second number exceeds a second threshold.

16. The data storage device as recited in claim 13, wherein the first clock generator comprises a timing capacitor.

17. The data storage device as recited in claim 13, wherein the second clock generator comprises a crystal resonator.

18. The data storage device as recited in claim 13, wherein:
- the first clock generator is operable to generate the first clock at different frequencies based on an environmental condition, wherein a frequency distribution for the first clock comprises a first standard deviation; and
- the second clock generator is operable to generate the second clock at different frequencies based on the environmental condition, wherein a frequency distribution for the second clock comprises a second standard deviation less than half the first standard deviation.

19. The data storage device as recited in claim 13, wherein at a beginning of the startup operation the first clock is operable to begin oscillating substantially sooner than the second clock.

20. The data storage device as recited in claim 13, wherein the non-volatile memory comprises a disk.

21. The data storage device as recited in claim 13, wherein the non-volatile memory comprises a semiconductor memory.

\* \* \* \* \*